United States Patent
Choi et al.

(10) Patent No.: US 7,646,653 B2
(45) Date of Patent: Jan. 12, 2010

(54) DRIVER CIRCUITS FOR INTEGRATED CIRCUIT DEVICES THAT ARE OPERABLE TO REDUCE GATE INDUCED DRAIN LEAKAGE (GIDL) CURRENT IN A TRANSISTOR AND METHODS OF OPERATING THE SAME

(75) Inventors: Jong-Hyun Choi, Gyeonggi-do (KR); Kyu-Chan Lee, Gyeonggi-do (KR); Sung-Min Yim, Gyeonggi-do (KR); Dong-Hak Shin, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 11/704,740

(22) Filed: Feb. 9, 2007

(65) Prior Publication Data

US 2008/0031060 A1   Feb. 7, 2008

(30) Foreign Application Priority Data

Aug. 2, 2006   (KR) .................... 10-2006-0073103

(51) Int. Cl.
*G11C 5/14* (2006.01)
*G11C 8/00* (2006.01)

(52) U.S. Cl. ..................... 365/189.09; 365/230.03; 365/230.06; 365/230.08

(58) Field of Classification Search ............ 365/189.11, 365/203, 229, 230.03, 230.06, 230.08, 189
See application file for complete search history.

(56) References Cited

U.S. PATENT DOCUMENTS

| | | | |
|---|---|---|---|
| 5,703,825 A * | 12/1997 | Akiba et al. ................. 365/229 |
| 6,166,987 A * | 12/2000 | Atsumi et al. .......... 365/230.06 |
| 6,333,874 B2 | 12/2001 | Yamauchi |
| 6,512,705 B1 | 1/2003 | Koelling et al. |
| 6,603,702 B2 * | 8/2003 | Kojima ................... 365/230.06 |
| 6,845,025 B1 * | 1/2005 | Nataraj ....................... 365/49.1 |
| 2004/0080358 A1 * | 4/2004 | Kushnarenko ............... 327/530 |
| 2004/0213038 A1 * | 10/2004 | Maruyama ................... 365/158 |
| 2007/0002636 A1 * | 1/2007 | Campbell et al. ....... 365/189.04 |
| 2008/0031060 A1 * | 2/2008 | Choi et al. ............. 365/189.11 |
| 2008/0074925 A1 * | 3/2008 | Ogura et al. ............ 365/185.09 |

* cited by examiner

*Primary Examiner*—Ly D Pham
(74) *Attorney, Agent, or Firm*—Myers Bigel Sibley & Sajovec, P.A.

(57) ABSTRACT

A driver circuit for an integrated circuit device includes a transistor that has a gate terminal, a source terminal, and a bulk substrate terminal. The source terminal is connected to the bulk substrate terminal. A pull-up circuit is connected between a power supply node and the source terminal. The pull up circuit is configured to increase a voltage at the source terminal and the bulk substrate terminal of the transistor responsive to a control signal.

15 Claims, 16 Drawing Sheets

DRIVER CIRCUITS FOR INTEGRATED CIRCUIT DEVICES THAT ARE OPERABLE TO REDUCE GATE INDUCED DRAIN LEAKAGE (GIDL) CURRENT IN A TRANSISTOR AND METHODS OF OPERATING THE SAME

RELATED APPLICATION

This application claims the benefit of and priority to Korean Patent Application No. 10-2006-0073103, filed Aug. 2, 2006, in the Korean Intellectual Property Office, the disclosure of which is hereby incorporated herein by reference as if set forth in its entirety.

FIELD OF THE INVENTION

The present invention relates generally to integrated circuit devices and methods of operating the same and, more particularly, to driver circuits for integrated circuit memory devices and methods of operating the same.

BACKGROUND OF THE INVENTION

For low-power circuit applications, it may be desirable to reduce transistor off-state leakage current. One contributor to off-state leakage current is gate-induced drain leakage (GIDL) current, which is caused by band-to-band tunneling in the drain region underneath the gate. When the potential difference between the gate and drain is relatively large, the energy bands may bend near the interface between the substrate and the gate dielectric to allow valence band electrons to tunnel into the conduction band. GIDL current may also affect the thickness of the gate oxide layer because the voltage required to cause this leakage current due to band-to-band tunneling decreases with decreasing gate oxide thickness. GIDL current may also be an important consideration in the design of dynamic random access memory (DRAM) devices as it may degrade data retention time in such devices:

FIG. 1 is a block diagram of a conventional semiconductor memory device 10 that includes a control circuit 20, address buffer 30, row decoders 40, memory cell array 50, sense amplifiers 60, data control circuit 70, and column decoders 80, which are configured as shown. The control circuit 20 is used to control operations of the address buffer 30 and the row decoders 40 responsive to one or more control signals. The address buffer 30 receives an address A0-An and divides the address into a row address and a column address; which are respectively used to drive the row decoders 40 and column decoders 80. The output of the row decoders 40 is used to select particular word lines of the memory cell array 50. The output of the column decoders 80 is used to select particular bits of words stored in the memory cell array 50 via the sense amplifiers 60 and the data control circuit 70. The data control circuit 70 may, for example, output data DQ0-DQ7 corresponding to eight bits from a selected word.

FIG. 2 illustrates a conventional word line driver circuit that may be used to select word lines 50 of FIG. 1. The word line driver circuit includes a PXI generator circuit 100 that generates PXI signals responsive to a control signal ACTIVE and the two least significant bits of a decoded row address. The memory cell array 50 may include multiple memory cell array sub-blocks 50a, 50b, etc. Accordingly, the word line driver circuit includes corresponding PXID driver circuits 200 that generate PXID and PXIB driver signals responsive to the PXI signal for the respective memory cell array sub-blocks 50a, 50b, etc. Sub-block word line driver circuits 400 drive the sub-block word lines in the respective memory cell arrays 50a and 50b responsive to the PXID signal, PXIB signal, and main word line signal MWL. The MWL generating circuit 300 generates the MWL signal responsive to the ACTIVE signal and the six most significant bits of the decoded row address.

FIG. 3 is a circuit diagram of the PXI generator circuit 100, and the PXID driver circuit 200 of FIG. 2. The PXI generator circuit 100 includes a NAND gate 110 that is coupled to an inverter circuit. The inverter circuit includes two transistors: a PMOS transistor 120 and an NMOS transistor 130, which are configured as shown. The PMOS transistor 120 is coupled to a boosted voltage VPP, which may be greater than an external voltage used to power the memory device. The NMOS transistor 130 is coupled to a common reference voltage VSS. The PXID driver circuit 200 includes two inverter circuits connected in series. The first inverter circuit includes a PMOS transistor 210 and an NMOS transistor 220 that are configured as shown. The first inverter circuit outputs the signal PXIB. The second inverter circuit includes a PMOS transistor 230 and an NMOS transistor 240, which are configured as shown. The second inverter circuit generates the output signal PXID responsive to the signal PXIB.

FIG. 4 is a circuit diagram of the MWL signal generating circuit 300 and the sub-block word line driver circuit 400 of FIG. 2. The MWL signal generating circuit 300 includes PMOS transistors 310 and 340 that are connected in parallel between the boosted voltage VPP and an input terminal of a first inverter circuit. NMOS transistors 320 and 330 are connected in series between the input terminal of the first inverter circuit and a common reference voltage VSS. PMOS transistor 310 is responsive to the ACTIVE signal, NMOS transistor 320 is responsive to the six most significant bits of the decoded row address, and NMOS transistor 300 is responsive to the ACTIVE signal. The first inverter circuit includes a PMOS transistor 350 and an NMOS transistor 360, which are configures as shown. The output node A of the first inverter circuit is coupled to the gate terminal of the PMOS transistor 340. The output node A is also coupled to the input of a second inverter circuit that includes PMOS transistor 370 and NMOS transistor 380, which are configured as shown. The second inverter circuit outputs the signal MWL responsive to the output of the first inverter circuit.

The sub-block word line driver circuit 400 includes an inverter circuit that includes a PMOS transistor 410 and an NMOS transistor 420, which are configured as shown and generates the sub-block word line signal SWL responsive to the main word line signal MWL. An NMOS transistor 430, which is responsive to the PXIB signal, is coupled between the output terminal of the inverter circuit and the common reference voltage VSS. As shown in FIG. 4, the source terminal, for example, of the PMOS transistor 410, is coupled to the output of the PXID driver circuit 200.

Operations of the MWL generating circuit 300 and the sub-block word line driver circuit 400 of FIGS. 2 and 4 are illustrated in the timing diagram of FIG. 5. During an active mode of operation, the ACTIVE signal is driven to the VPP level while the voltage at node A of FIG. 4 is at either VPP or 0V depending on whether a particular decoded row address bit is selected. The main word line signal MWL is the logical inverse of the signal at node A. During a standby or precharge mode of operation, however, the ACTIVE signal is driven low (0V) while the main word line signal MWL is driven to the VPP level. As shown in FIG. 3, when the ACTIVE signal is low, the PXID signal is driven low, e.g., 0V. As the boosted voltage VPP may be approximately 4.0V in some applications, the voltage differential between the gate terminal and the source terminal, for example, of the PMOS transistor 410 of FIG. 4, may be approximately 4.0V. As the gate oxide of the PMOS transistor 410 may be relatively thin, the PMOS transistor 410 may be susceptible to GIDL current when the sub-block word line driver circuit 400 is in a standby or precharge mode of operation.

SUMMARY

According to some embodiments of the present invention, a driver circuit for an integrated circuit device includes a transistor that has a gate terminal, a source terminal, and a bulk substrate terminal. The source terminal is connected to the bulk substrate terminal. A pull-up circuit is connected between a power supply node and the source terminal. The pull up circuit is configured to increase a voltage at the source terminal and the bulk substrate terminal of the transistor responsive to a control signal.

In other embodiments of the present invention, the integrated circuit device is an integrated circuit memory device and the driver circuit is a word line driver circuit.

In still other embodiments of the present invention, the driver circuit further includes a global power supply node, wherein the global power supply node is a local power supply node.

In still other embodiments of the present invention, the pull-up circuit includes a pull-up transistor that is connected between the source terminal and the local power supply node.

In still other embodiments of the present invention, an inverter circuit is connected to the power supply node and has an output connected to the source terminal. A switch is connected between the inverter circuit and a common reference node. The switch is responsive to the control signal.

In still other embodiments of the present invention, the switch is an NMOS transistor and the pull-up transistor is a PMOS transistor.

In still other embodiments of the present invention, the transistor is a PMOS transistor.

In still other embodiments of the present invention, the driver circuit is placed into one of an active mode and a standby mode responsive to the control signal.

According to further embodiments of the present invention, a driver circuit for an integrated circuit device includes a transistor that has a gate terminal and a source terminal. A pull-down circuit is connected between a power supply node and the gate terminal. The pull-down circuit is configured to reduce a voltage at the gate terminal of the transistor responsive to a control signal.

In further embodiments of the present invention, the integrated circuit device is an integrated circuit memory device and the driver circuit is a word line driver circuit.

In still further embodiments of the present invention, the pull-down circuit includes at least one voltage-reducing element that is connected between the gate terminal of the transistor and the power supply node.

In still further embodiments of the present invention, the at least one voltage-reducing element includes two transistors connected in series.

In still further embodiments of the present invention, the pull-down circuit is configured to reduce the voltage at the gate terminal by about twice a threshold voltage associated with one of the transistors comprising the at least one voltage-reducing element.

In still further embodiments of the present invention, a switch is connected to the power supply node and is responsive to the control signal. An inverter circuit is connected between the switch and a common reference node and has an output that is connected to the gate terminal.

In still further embodiments of the present invention, the switch is a PMOS transistor and the two transistors comprising the at least one voltage-reducing element are NMOS transistors.

In still further embodiments of the present invention, the transistor is a PMOS transistor.

In still further embodiments of the present invention, the driver circuit is placed into one of an active mode and a standby mode responsive to the control signal.

According to other embodiments of the present invention, a driver for an integrated circuit device includes a transistor having a gate terminal and a source terminal. A switching circuit is connected between the gate terminal and first and second power supply nodes. The switching circuit is operable to disconnect the first power supply node from the gate terminal and to connect a second power supply node to the gate terminal so as to reduce a voltage at the gate terminal responsive to a control signal.

In other embodiments of the present invention, the switching circuit includes a first switch that is connected between the first power supply node and the gate terminal. A second switch is connected between the second power supply node and the gate terminal.

In still other embodiments of the present invention, the first switch includes a first transistor and the second switch includes a second transistor. The driver circuit includes an inverter that is connected between a gate terminal of the first transistor and a source of the control signal. A gate terminal of the second transistor is connected to the source of the control signal.

In still other embodiments of the present invention, the first and second transistors are PMOS transistors.

In still other embodiments of the present invention, the transistor is a PMOS transistor.

In still other embodiments of the present invention, the driver circuit is placed into one of an active mode and a standby mode responsive to the control signal.

According to further embodiments of the present invention, an integrated circuit memory device includes a word line driver circuit and first and second power supply nodes that provide different voltage levels. A switching circuit is connected between the word line driver circuit and the first and second power supply nodes. The switching circuit is operable to connect one of the first and second power supply nodes to the word line driver circuit responsive to a control signal.

In further embodiments of the present invention, the word line driver circuit is associated with a memory block and the switching circuit is responsive to a block address.

In still further embodiments of the present invention, the word line driver circuit is responsive to at least a portion of a row address.

In still further embodiments of the present invention, the word line driver circuit is placed into one of an active mode and a standby mode responsive to the control signal.

According to other embodiments of the present invention, an integrated circuit device includes first and second power supply nodes. A first circuit portion is connected to the first power supply node and includes at least one thin oxide transistor. A second circuit portion includes at least one thick oxide transistor. A switching circuit is connected between the first and second circuit portions and the first and second power supply nodes. The switching circuit is operable to connect one of the first and second power supply nodes to the second circuit portion responsive to a control signal.

In other embodiments of the present invention, the first and second circuit portions are associated with a memory block and the switching circuit is responsive to a block address.

In still other embodiments of the present invention, the first and second circuit portions are responsive to at least a portion of a row address.

In still other embodiments of the present invention, the first circuit portion is responsive to the block address and the second circuit portion is responsive to at least a portion of a row address.

In still other embodiments of the present invention, the word line driver circuit is placed into one of an active mode and a standby mode responsive to the control signal.

Although described above primarily with respect to circuit and/or memory device embodiments of the present invention, it will be understood that the present invention can be embodied as a circuit, memory device, and/or method.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
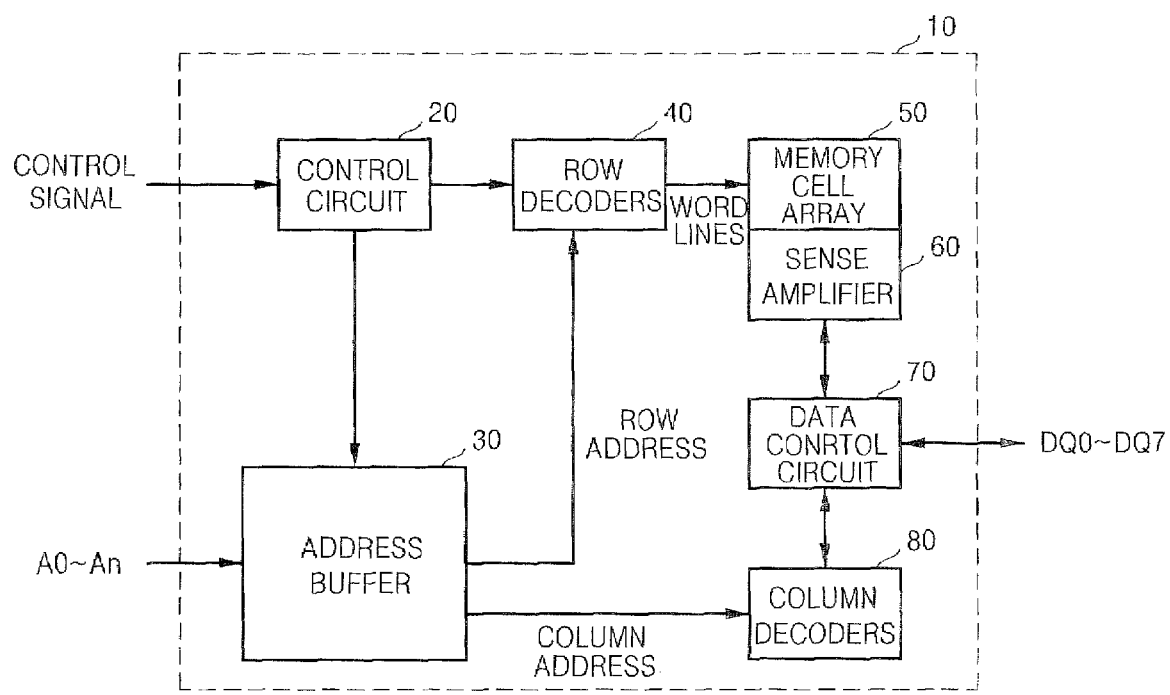
FIG. 1 is a block diagram that illustrates a conventional semiconductor memory device.
Figure 2:
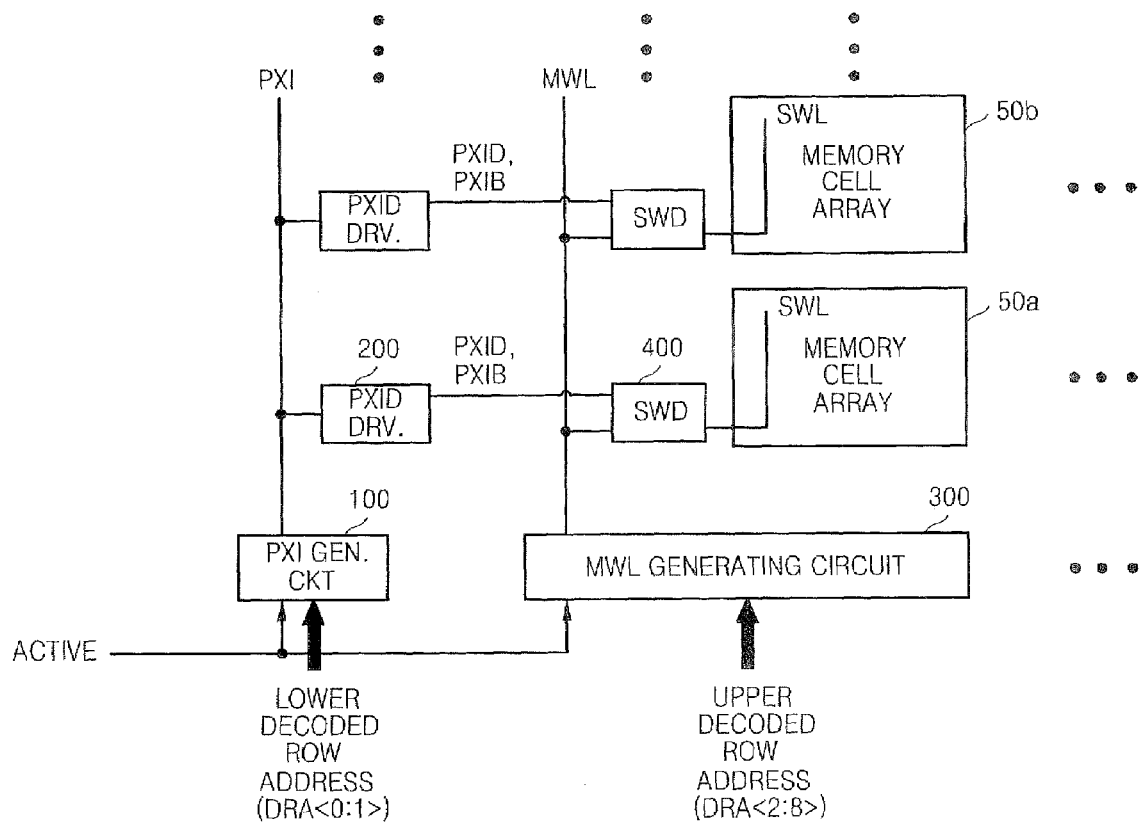
FIG. 2 is a block diagram that illustrates a conventional word line driver circuit.

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention stem from a realization that gate-induced drain leakage (GIDL) current may be reduced or eliminated by reducing the potential difference between the gate and source or drain terminals of a transistor. For example, driver circuits that may be used in integrated circuit memory devices may include pull-up and/or pull-down circuits to reduce the potential difference between the gate and source or drain terminals of a transistor. This may be particularly useful during standby or precharge operational intervals in which the source terminal of a transistor of an inverter of a word line driver circuit is driven low by a PXID signal while the gate terminal of the transistor is driven to a boosted voltage level VPP. In this case, pull-up circuitry may be used to increase the voltage applied to the source terminal of the transistor and/or pull-down circuitry may be used to decrease the voltage applied to the gate terminal of the transistor.

Figure 3:
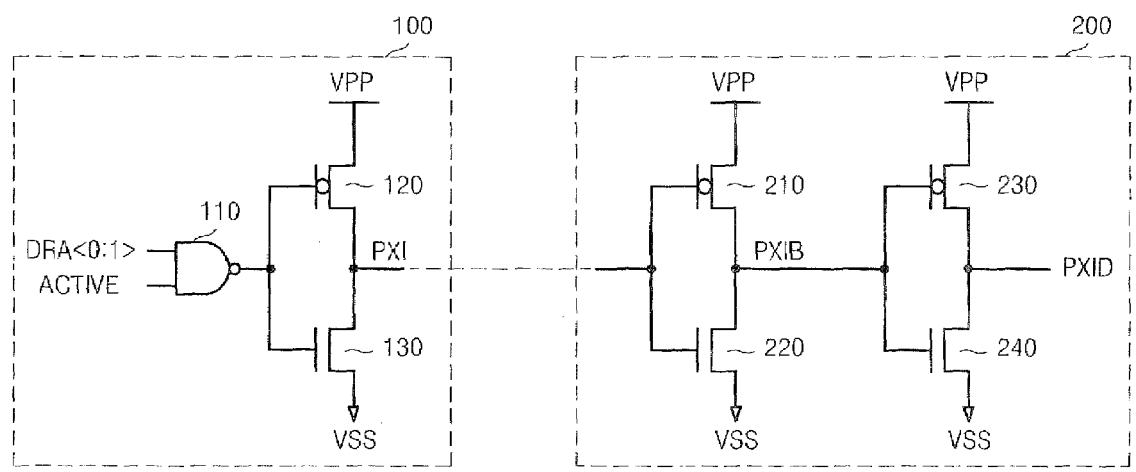
FIG. 3 is a circuit schematic of the PXI generator circuit and the PXID driver circuit of FIG. 2.
Figure 4:
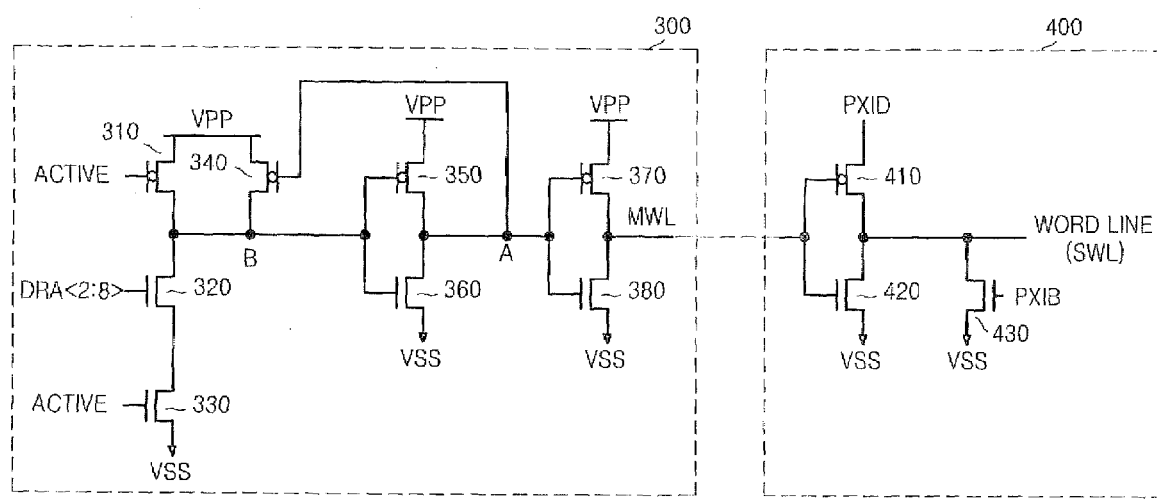
FIG. 4 is a circuit diagram of the MWL signal generating circuit and the sub-block word line driver circuit of FIG. 2.
Figure 6:
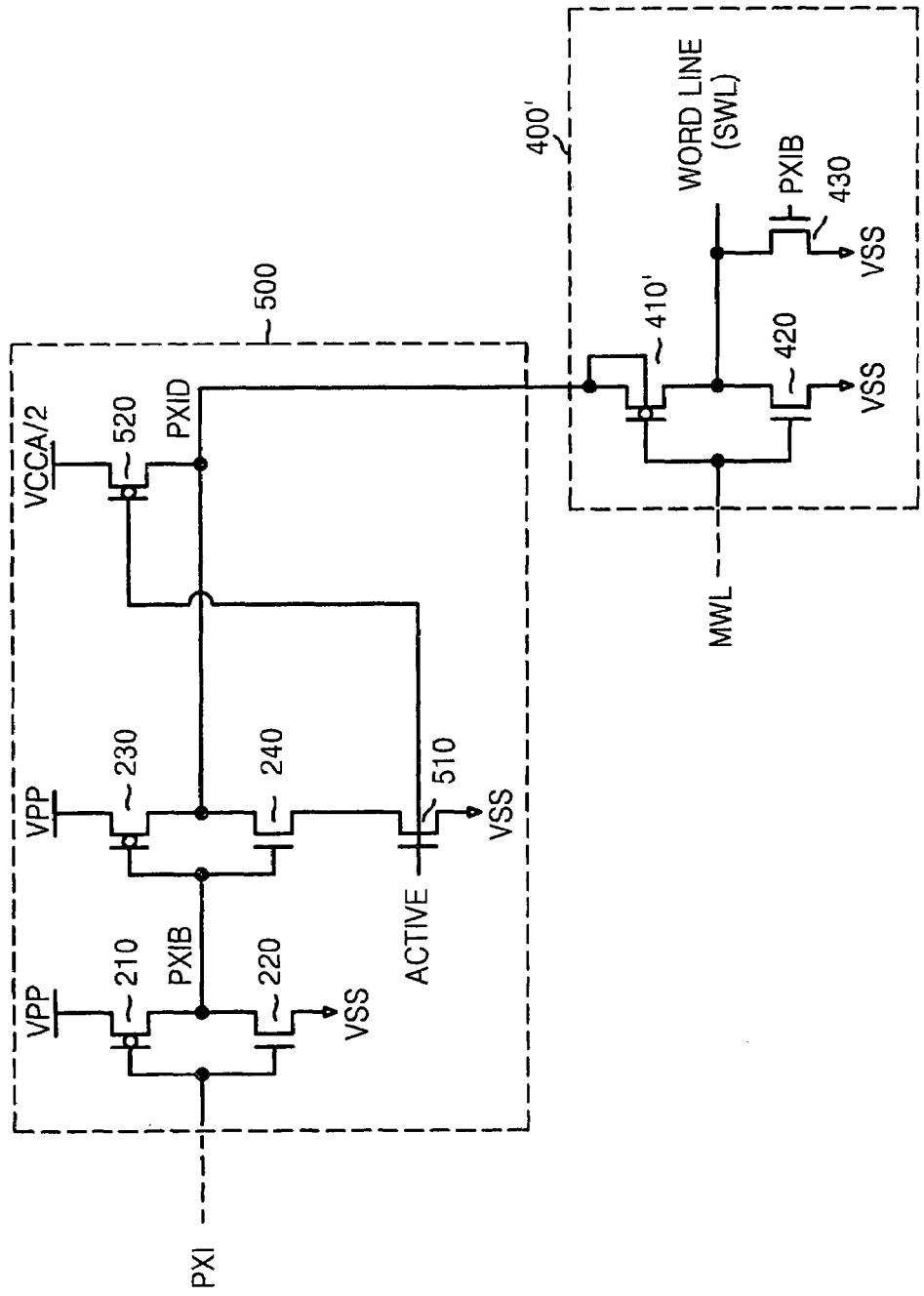
FIG. 6 is a circuit schematic of a driver circuit for an integrated circuit device, such as an integrated circuit memory device, according to some embodiments of the present invention.

Referring to FIG. 6, a driver circuit for an integrated circuit device, such as an integrated circuit memory device, according to some embodiments of the present invention, includes a PXID driver circuit 500 and a sub-block word line driver circuit 400'. The PXID driver circuit 500 is similar to the PXID driver circuit 200 of FIG. 3 described above, but includes a switch circuit comprising NMOS transistor 510 and a pull-up circuit comprising PMOS transistor 520, which are configured as shown. The PMOS transistor 520 is connected to a local power supply node that provides an internally generated voltage of VCCA/2. The global power supply node providing a boosted voltage VPP is used to power the two inverter circuits. In some embodiments, the boosted voltage VPP may be about 4.0V while the internally generated voltage VCCA may be about 2.5V. The sub-block word line driver circuit 400' is similar to the sub-block word line driver circuit 400 of FIG. 4 with the exception that the transistor 410' has its source terminal connected to the bulk substrate terminal.

Figure 5:
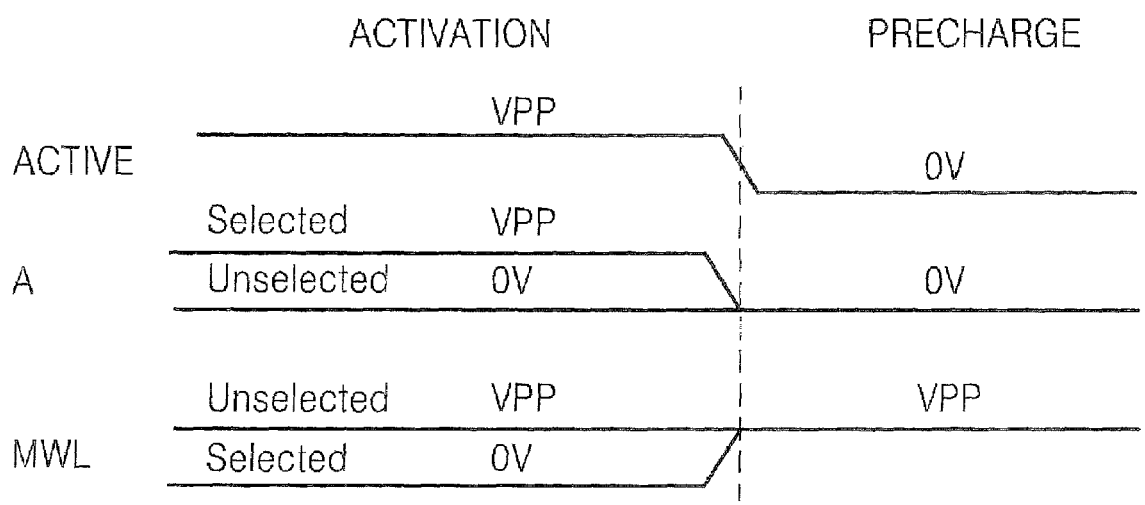
FIG. 5 is a timing diagram that illustrates operations of the word line driver circuit of FIG. 2.
Figure 7:
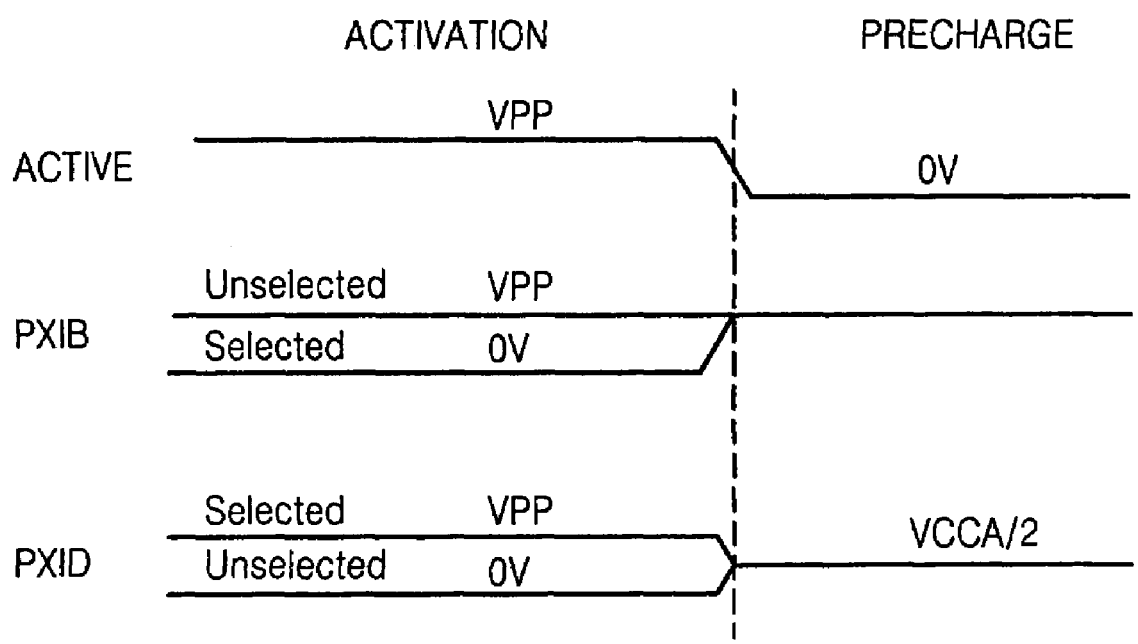
FIG. 7 is a timing diagram that illustrates operations of the driver circuit of FIG. 6 according to some embodiments of the present invention.

Operations of the driver circuit of FIG. 6, according to some embodiments of the present invention, are illustrated with respect to the timing diagram of FIG. 7 and the circuit schematic of FIG. 6. Similar to the description above with respect to the timing diagram of FIG. 5, the ACTIVE signal is driven high (VPP voltage level) when the driver circuit of FIG. 6 is in an active or operational mode. During a standby or precharge mode, however, the ACTIVE signal is driven low, e.g., 0V, which turns NMOS transistor 510 off and turns PMOS transistor 520 on so that the PXID signal is output at a voltage level VCCA/2. In contrast with a conventional driver circuit, the source and bulk substrate terminals of transistor 410' of the sub-block word line driver circuit are pulled up from 0V to a voltage level of VCCA/2, which may be about 1.25V. As the main word line signal MWL is typically driven to the boosted voltage level VPP during standby or precharge mode, the potential difference between the gate terminal of the transistor 410' and the source/bulk substrate terminals may be less than 3V, which may reduce or prevent GIDL current in the transistor 410'.

Figure 8:
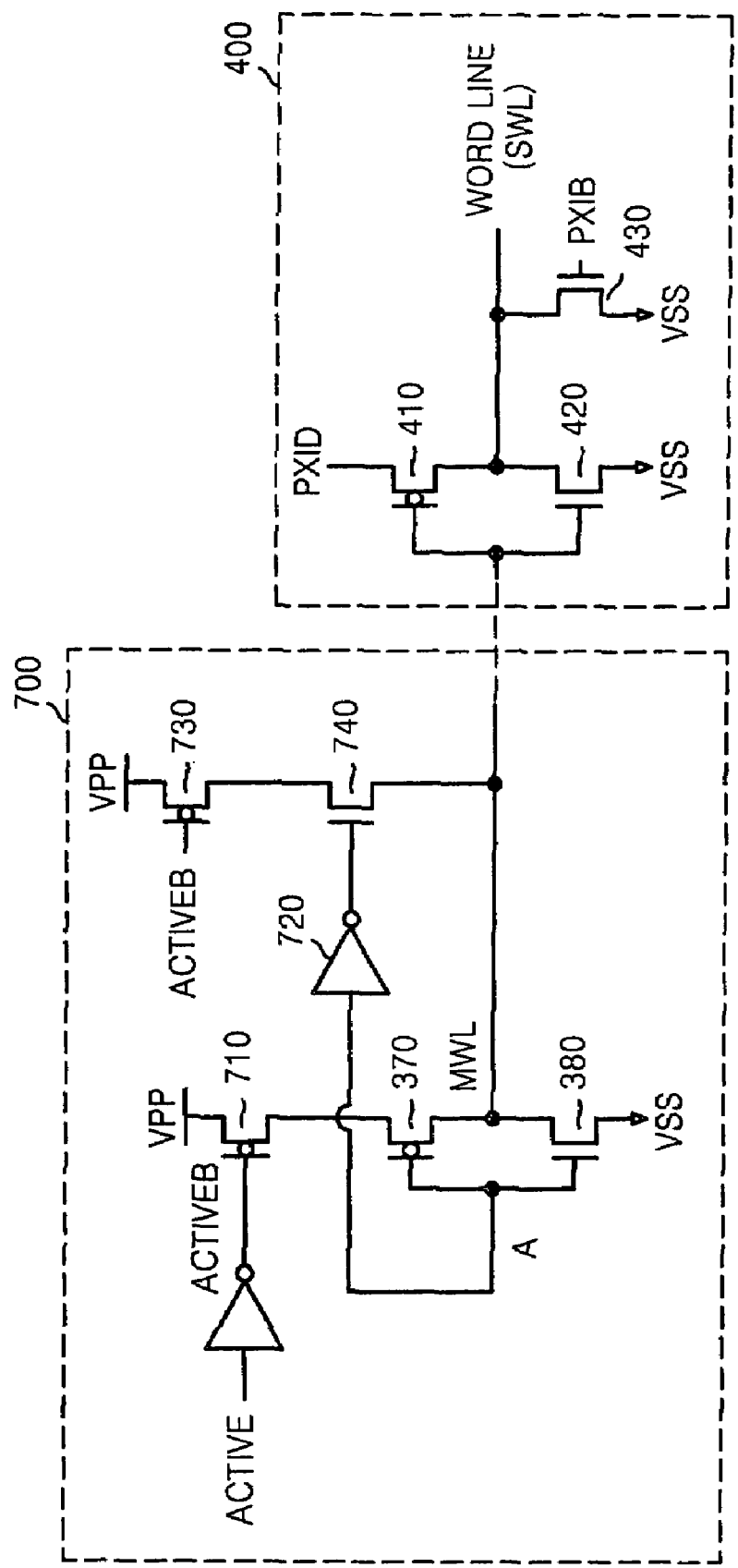
FIG. 8 is a circuit schematic of a driver circuit for an integrated circuit device, such as an integrated circuit memory device, according to further embodiments of the present invention.

Referring to FIG. 8, a driver circuit for an integrated circuit device, such as an integrated circuit memory device, according to further embodiments of the present invention, includes an MWL signal generating circuit 700 and a sub-block word line driver circuit 400. The sub-block word line driver circuit 400 has been described above with respect to FIG. 4. The MWL signal generating circuit 700 includes an inverter circuit comprising PMOS transistor 370 and NMOS transistor 380 that generates the MWL signal responsive to the signal at node A of the MWL signal generating circuit 300 of FIG. 4. The MWL signal generating circuit 700 further comprises a PMOS transistor 710 that receives the signal ACTIVEB, which is the inverted signal ACTIVE, at a gate terminal thereof. A pull-down circuit comprising NMOS transistors 730 and 740 is coupled between a power supply node providing the boosted voltage VPP and the output terminal of the MWL signal generating circuit 700. An inverter 720 connects node A to the gate terminal of NMOS transistor 740.

Figure 9:
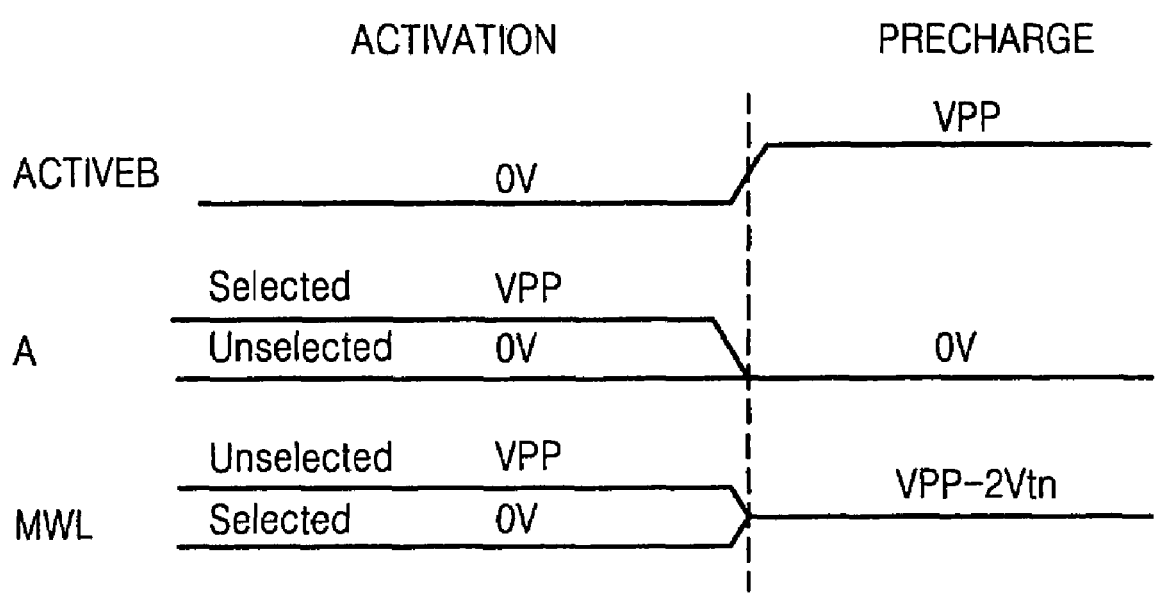
FIG. 9 is a timing diagram that illustrates operations of the driver circuit of FIG. 8 according to some embodiments of the present invention.

Operations of the driver circuit of FIG. 8, according to some embodiments of the present invention, are illustrated with respect to the timing diagram of FIG. 9 and the circuit schematic of FIG. 8. Similar to the description above with respect to the timing diagram of FIG. 5, the ACTIVE signal is driven high (VPP voltage level) when the driver circuit of FIG. 8 is in an active or operational mode, which results in ACTIVEB being low. During a standby or precharge mode, however, the ACTIVE signal is driven low, e.g., 0V, which results in ACTIVEB being high (VPP voltage level) which turns PMOS transistor 710 off. The voltage at node A is low, e.g., 0V during standby or precharge mode, which would ordinarily result in the MWL signal being driven high. Because the PMOS transistor 710 is turned off, however, the MWL signal is output-based on the operation of NMOS transistors 730 and 740. During standby or precharge mode, both NMOS transistors 730 and 740 are turned on resulting in the MWL signal being driven to a level of VPP−2Vtn, where Vtn is the threshold voltage for turning on either of NMOS transistors 730 and 740. As the PXID signal is low, e.g., 0V during standby or precharge mode, the potential difference between the gate terminal of the transistor 410 and the source terminal of the transistor 410 may be reduced from VPP to VPP−2Vtn, which may reduce or prevent GIDL current in the transistor 410.

Figure 10:
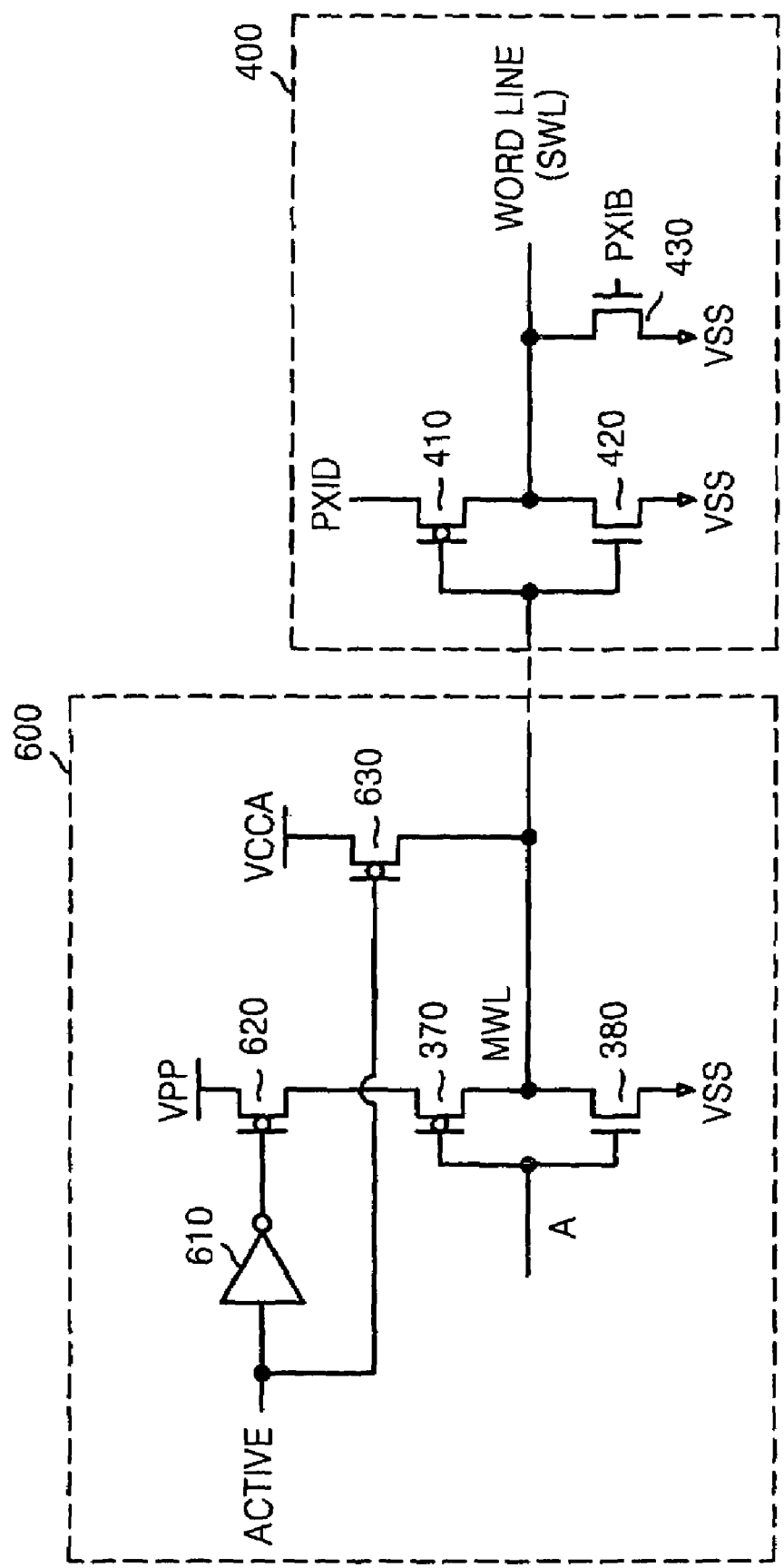
FIG. 10 is a circuit schematic of a driver circuit for an integrated circuit device, such as an integrated circuit memory device, according to further embodiments of the present invention.

Referring to FIG. 10, a driver circuit for an integrated circuit device, such as an integrated circuit memory device, according to further embodiments of the present invention, includes an MWL signal generating circuit 600 and a sub-block word line driver circuit 400. The sub-block word line driver circuit 400 has been described above with respect to FIG. 4. The MWL signal generating circuit 600 includes an inverter circuit comprising PMOS transistor 370 and NMOS transistor 380 that generates the MWL signal responsive to the signal at node A of the MWL signal generating circuit 300 of FIG. 4. The MWL signal generating circuit 600 further comprises a switching circuit comprising PMOS transistors 620 and 630 that are operable to connect the global boosted power supply voltage VPP to the output node of the MWL signal generating circuit 600 or the local, internally generated power supply voltage VCCA to the output node of the MWL signal generating circuit 600 responsive to the control signal ACTIVE.

Figure 11:
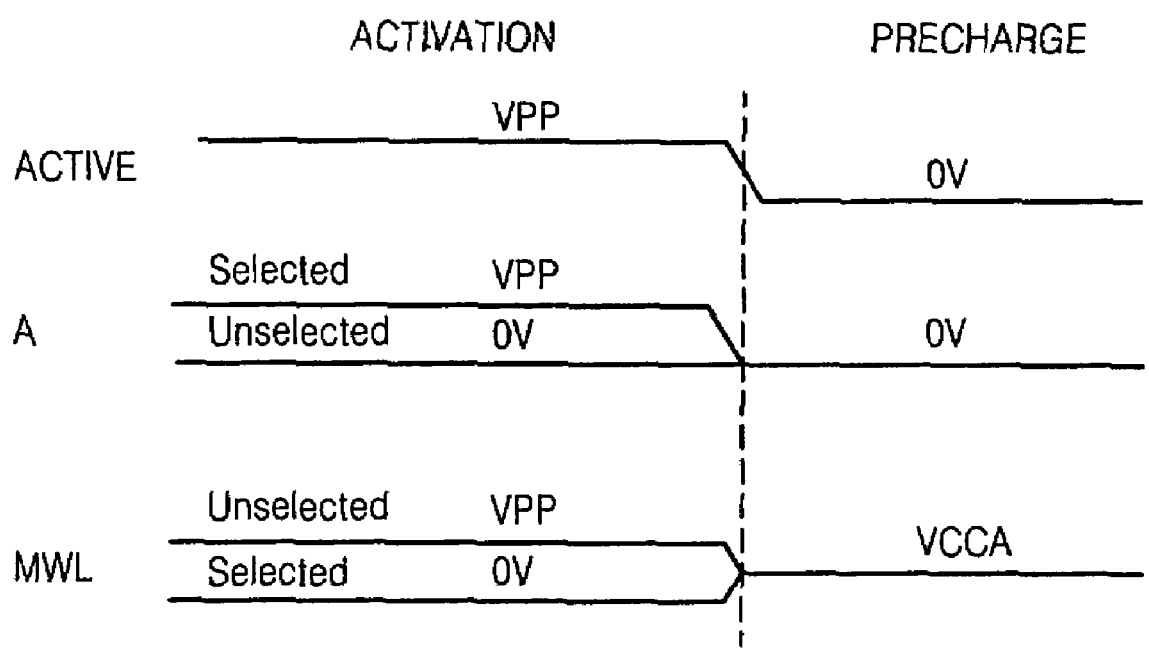
FIG. 11 is a timing diagram that illustrates operations of the driver circuit of FIG. 10 according to some embodiments of the present invention.

Operations of the driver circuit of FIG. 10, according to some embodiments of the present invention, are illustrated with respect to the timing diagram of FIG. 11 and the circuit schematic of FIG. 10. Similar to the description above with respect to the timing diagram of FIG. 5, the ACTIVE signal is driven high (VPP voltage level) when the driver circuit of FIG. 10 is in an active or operational mode. During a standby or precharge mode, however, the ACTIVE signal is driven low, e.g., 0V. The inverter 610 inverts the ACTIVE signal to turn PMOS transistor 620 off. The voltage at node A is low, e.g., 0V during standby or precharge mode, which would ordinarily result in the MWL signal being driven high. Because the PMOS transistor 620 is turned off, however, the MWL signal is output based on the operation of PMOS transistor 630. During standby or precharge mode, PMOS transistor 630 is turned on resulting in the MWL signal being driven to a level of VCCA, which may be about 2.5V in some embodiments of the present invention as discussed above. Thus, the PMOS transistors 620 and 630 along with the inverter 610 may be used to disconnect the boosted power supply voltage VPP node from the output terminal of the MWL signal generating circuit 600 and to connect the internally generated power supply voltage VCCA node to the output terminal of the MWL signal generating circuit 600 responsive to the control signal ACTIVE. As the PXID signal is low, e.g., 0V during standby or precharge mode, the potential difference between the gate terminal of the transistor 410 and the source terminal of the transistor 410 may be reduced from VPP to VCCA, which may reduce or prevent GIDL current in the transistor 410.

Figure 12:
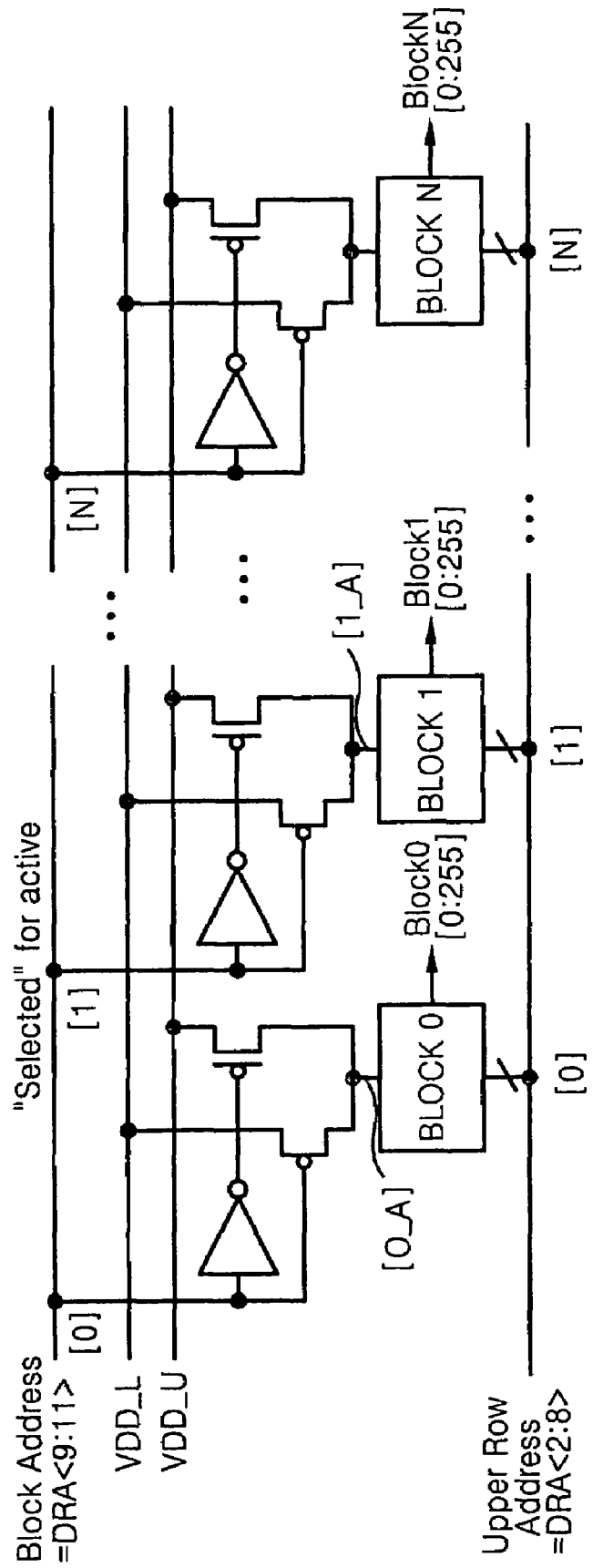
FIG. 12 is a circuit schematic of a driver circuit for an integrated circuit device, such as an integrated circuit memory device, according to further embodiments of the present invention.

Referring to FIG. 12, an integrated circuit memory device, according to some embodiments of the present invention, includes a plurality of memory sub-blocks labeled Block 0 through Block N. Each of the memory sub-blocks may have a word line driver circuit associated therewith. Switching circuitry couples two power supply nodes that supply voltages VDD_L and VDD_U, respectively, to the word line driver circuit in each of the memory sub-blocks. As shown in FIG. 12, the switching circuitry comprises two PMOS transistors and an inverter that are configured as shown.

Figure 13:
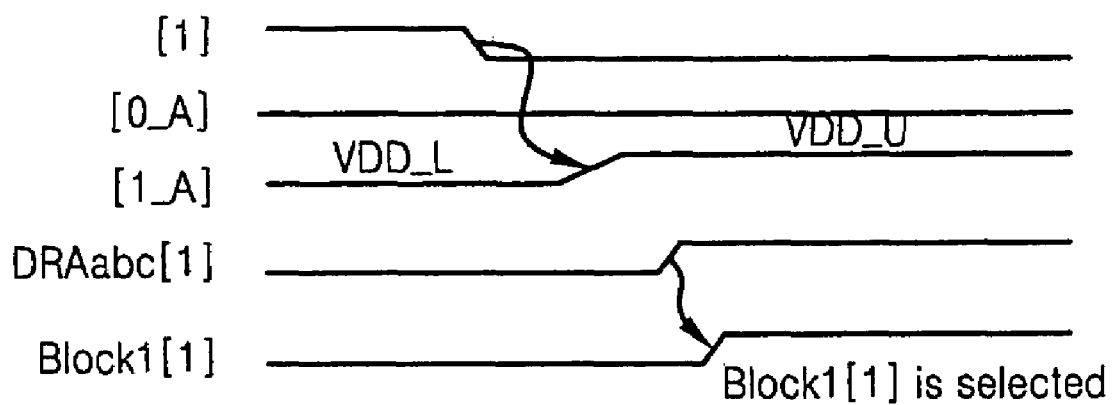
FIG. 13 is a timing diagram that illustrates operations of the driver circuit of FIG. 12 according to some embodiments of the present invention.

Operations of the integrated circuit memory device of FIG. 12, according to some embodiments of the present invention, are illustrated with respect to the timing diagram of FIG. 13 and the block diagram of FIG. 12. Referring to Block 1 of FIG. 12, during a standby or precharge mode, the block address [1] is high. The switching circuitry selects the supply voltage VDD_L to be applied to the word line driver circuit in Block 1 at node [1_A]. The voltage VDD_L is less than the voltage VDD_U and may be applied to a gate of a transistor of the word line driver circuit to reduce the potential difference between the gate and a source terminal, for example, to reduce GIDL current in the transistor. To transition into operational mode, the block address [1] is driven low, which causes the switching circuitry to select the supply voltage VDD_U to be applied at node [1_A]. The decoded upper portion of the row address for Block 1 is driven high and Block 1 is selected as indicated by the signal Block1 [1].

Figure 14:
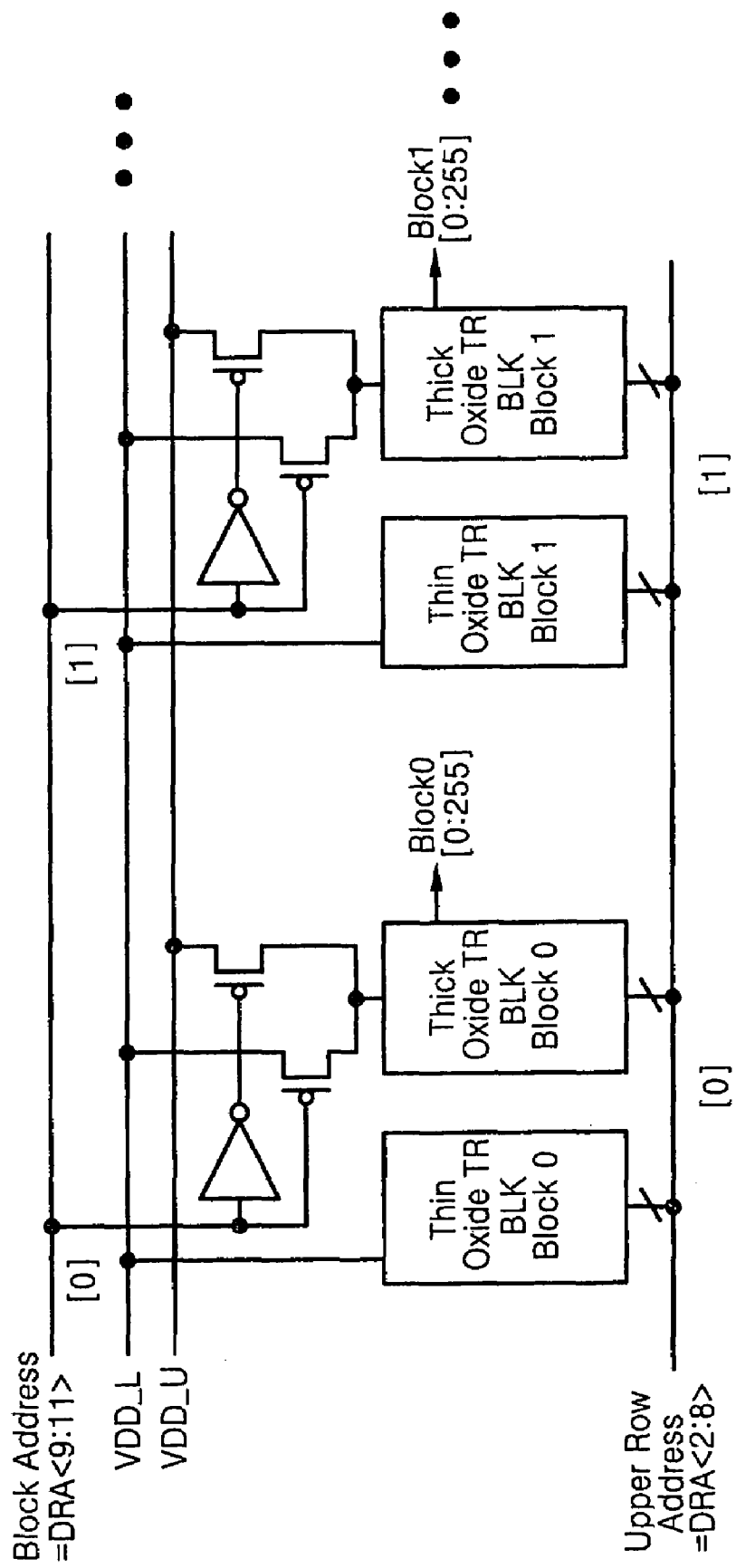
FIG. 14 is a circuit schematic of a driver circuit for an integrated circuit device, such as an integrated circuit memory device, according to further embodiments of the present invention.
Figure 15:
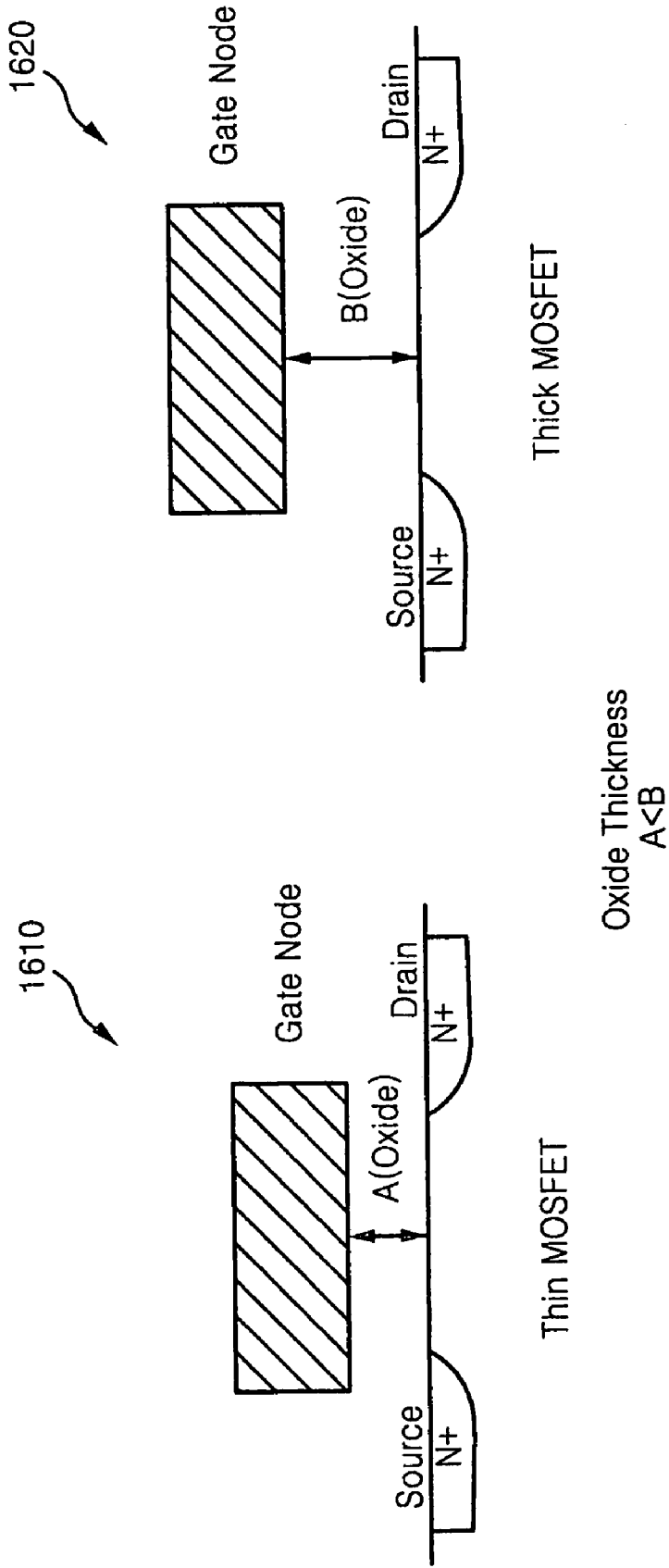
FIG. 15 is a cross-sectional diagram that illustrates thin and thick oxide transistors according to some embodiments of the present invention.

Referring to FIG. 14, an integrated circuit device, such as, for example, an integrated circuit memory device, according to some embodiments of the present invention, includes a plurality of sub-blocks labeled Block0, Block1, ... etc. Each of the sub-blocks includes a first circuit portion that includes at least one thin oxide transistor and a second circuit portion that includes at least one thick oxide transistor. This is illustrated, for example, in FIG. 15 where a MOSFET may be classified as a thin or thick oxide transistor based on the thickness of the gate oxide disposed between the gate terminal and the substrate. Switching circuitry couples two power supply nodes that supply voltages VDD_L and VDD_U, respectively, to the second circuit portions that include one or more thick oxide transistors. The switching circuitry is operable to apply either VDD_L or VDD_U to the second circuit portions responsive to the block address in similar fashion to the switching circuitry discussed above with respect to FIGS. 12 and 13. The first circuit portions that include one or more thin oxide transistors receive voltage VDD_L. The voltage VDD_L is less than the voltage VDD_U and may be applied to a gate of a transistor of the word line driver circuit to reduce the potential difference between the gate and a source terminal, for example, to reduce GIDL current in the transistor. As shown in FIG. 14, both the first and second circuit portions of each of the sub-blocks are responsive to the decoded upper portion of the row address.

Figure 16:
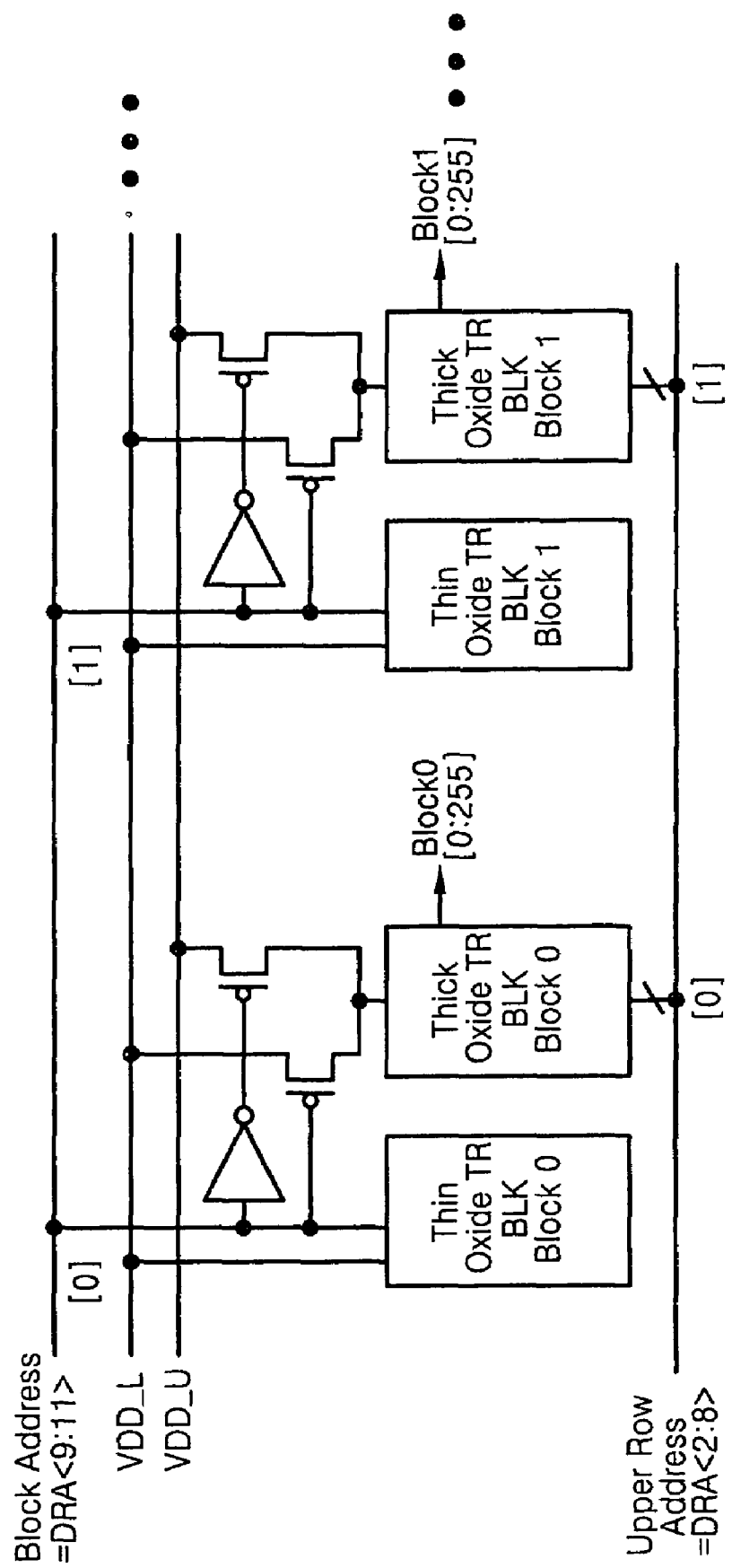
FIG. 16 is a circuit schematic of a driver circuit for an integrated circuit device, such as an integrated circuit memory device, according to further embodiments of the present invention.

Referring to FIG. 16, an integrated circuit device, such as, for example, an integrated circuit memory device, according to some embodiments of the present invention, may be similar to the integrated circuit device of FIG. 14, with the exception being that only the second circuit portions of each of the sub-blocks, i.e., the circuit portions that include one or more thick oxide transistors, are responsive to the upper portion of the row address.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A driver circuit for an integrated circuit device, comprising:
    a transistor having a gate terminal to receive a Main Word Line (MWL) signal and a source terminal; and
    a MWL signal generation circuit that is connected between the gate terminal and a first power supply node, second power supply node, and a common reference voltage node and generates the MWL signal;
    wherein the MWL signal generation circuit selectively connects the first power supply node or the common reference voltage node to the gate terminal in an active mode and connects the second power supply node to the gate terminal to reduce a voltage at the gate terminal in a standby mode; and
    wherein a voltage level of the second power supply node is lower than a voltage level of the first power supply node and higher than a voltage level of the common reference voltage node.

2. The driver circuit of claim 1, wherein the switching circuit comprises:
    a first switch connected between the first power supply node and the gate terminal; and
    a second switch connected between the second power supply node and the gate terminal.

3. The driver circuit of claim 2, wherein the first switch comprises a first transistor, the second switch comprises a second transistor, and the driver circuit further comprises:
    an inverter connected between a gate terminal of the first transistor and a source of a control signal;
    wherein a gate terminal of the second transistor is connected to the source of the control signal.

4. The driver circuit of claim 3, wherein the first and second transistors are PMOS transistors.

5. The driver circuit of claim 1, wherein the transistor is a PMOS transistor.

6. The driver circuit of claim 1, wherein the driver circuit is placed into one of the active mode and the standby mode responsive to the control signal.

7. A method of operating a driver circuit for an integrated circuit device, the driver circuit comprising a transistor having a gate terminal and a source terminal, the method comprising:
    selectively connecting a first power supply node or common reference voltage node to the gate terminal in an active mode; and
    connecting a second power supply node to the gate terminal to reduce a voltage at the gate terminal in a standby mode;
    wherein a voltage level of the second power supply node is lower than a voltage level of the first power supply node and higher than a voltage level of the common reference node.

8. The method of claim 7, further comprising:
    placing the driver circuit into one of the active mode and the standby mode responsive to the control signal.

9. An integrated circuit memory device, comprising:
a word line driver circuit;
first and second power supply nodes that provide different voltage levels; and
a switching circuit that is connected between the word line driver circuit and the first and second power supply nodes, the switching circuit being operable to connect one of the first and second power supply nodes to the word line driver circuit responsive to a control signal so as to reduce gate induced drain leakage current in a transistor of the word line driver circuit when the word line driver circuit is in a standby mode;
wherein the switching circuit comprises a first PMOS transistor that is connected between the word line driver circuit and the first power supply node and a second PMOS transistor that is connected between the word line driver circuit and the second power supply node.

10. The integrated circuit memory device of claim 9, wherein the word line driver circuit is associated with a memory block and the switching circuit is responsive to a block address.

11. The integrated circuit memory device of claim 10, wherein the word line driver circuit is responsive to at least a portion of a row address.

12. The driver circuit of claim 9, wherein the word line driver circuit is placed into one of an active mode and a the standby mode responsive to the control signal.

13. A method of operating an integrated circuit memory device, the memory device comprising a word line driver circuit and first and second power supply nodes that provide different voltage levels, the method comprising:
connecting one of the first and second power supply nodes to the word line driver circuit via a transistor that is connected between the word line driver circuit and the first power supply node and a second transistor that is connected between the word line driver circuit and the second power supply node responsive to a control signal so as to reduce gate induced drain leakage current in a transistor of the word line driver circuit when the word line driver circuit is in a standby mode.

14. The method of claim 13, wherein the word line driver circuit is associated with a memory block and connecting one of the first and second power supply nodes to the word line driver circuit comprises:
connecting one of the first and second power supply nodes to the word line driver circuit responsive to a block address.

15. The method of claim 13, further comprising:
placing the word line driver circuit into one of an active mode and the standby mode responsive to the control signal.

* * * * *